US009726699B2

(12) United States Patent
Rietman et al.

(10) Patent No.: US 9,726,699 B2
(45) Date of Patent: Aug. 8, 2017

(54) DISAGGREGATION APPARATUS FOR BEING USED IN A MULTI-GROUP ELECTRICAL NETWORK

(71) Applicant: PHILIPS LIGHTING HOLDING B.V., Eindhoven (NL)

(72) Inventors: Ronald Rietman, Eindhoven (NL); Ying Wang, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/896,694

(22) PCT Filed: Jun. 12, 2014

(86) PCT No.: PCT/EP2014/062177
§ 371 (c)(1),
(2) Date: Dec. 8, 2015

(87) PCT Pub. No.: WO2014/198802
PCT Pub. Date: Dec. 18, 2014

(65) Prior Publication Data
US 2016/0146863 A1    May 26, 2016

(30) Foreign Application Priority Data
Jun. 14, 2013 (EP) ..................................... 13172133

(51) Int. Cl.
*G01R 19/25* (2006.01)
*H02J 13/00* (2006.01)

(52) U.S. Cl.
CPC ......... *G01R 19/2513* (2013.01); *G01R 19/25* (2013.01); *H02J 13/00* (2013.01);
(Continued)

(58) Field of Classification Search
CPC .... G01R 19/00; G01R 19/25; G01R 19/2513; H02J 13/00; H02J 13/0003; H02J 13/0006;
(Continued)

(56) References Cited

U.S. PATENT DOCUMENTS 4,006,413 A    2/1977  Silberberg
4,746,909 A  *  5/1988  Israel .................. G08B 13/1445
                                                        340/568.1
(Continued)

FOREIGN PATENT DOCUMENTS

EP    2463670 A1    6/2012
NO    2011153401 A2    12/2011
(Continued)

OTHER PUBLICATIONS

Giri, Suman et al "A Study on the Feasibility of Automated Data Labeling and Trianing using an EMF Sensor in NILM Platforms", 2012.

*Primary Examiner* — Hoai-An D Nguyen

(57) ABSTRACT

The invention relates to a disaggregation apparatus (4) for being used in a multi-group electrical network (5), which comprises multiple electrical groups (1, 2, 3), each comprising one or more appliances ($1_1$, $1_2$, $1_3$, $2_1$, $2_2$, $2_3$, $3_1$, $3_2$, $3_3$). A determination unit (7) determines an electrical group (1, 2, 3) comprising an appliance, of which an operational state has been changed, based on first changes in mains voltages ($V_1$, $V_2$, $V_3$) measured while the operational state change occurs, second and third changes in the mains voltages ($V_1$, $V_2$, $V_3$) measured while switchable loads ($1_n$, $2_n$, $3_n$) are switched, and the resistances ($R_{1n}$, $R_{2n}$, $R_{3n}$) of the switchable loads ($1_n$, $2_n$, $3_n$). Thus, a misdetection due to an operational state change of an appliance in another electrical group may be avoided and the accuracy of disaggregation may be improved in a multi-group electrical network (5).

15 Claims, 2 Drawing Sheets

(52) U.S. Cl.
CPC .............. *Y02E 60/74* (2013.01); *Y04S 10/30* (2013.01); *Y04S 20/38* (2013.01)

(58) Field of Classification Search
CPC ... H02J 13/0093; H02J 13/0096; Y02E 60/00; Y02E 60/74; Y04S 10/30; Y04S 20/00; Y04S 20/30; Y04S 20/38
USPC ................................................ 324/600, 602
See application file for complete search history.

(56) References Cited

U.S. PATENT DOCUMENTS

| | | | |
|---|---|---|---|
| 4,858,141 A * | 8/1989 | Hart | G01R 21/1331 340/657 |
| 5,483,153 A | 1/1996 | Leeb | |
| 6,081,123 A * | 6/2000 | Kasbarian | H02J 13/0048 324/521 |
| 6,657,424 B1 | 12/2003 | Voisine | |
| 9,176,192 B2 * | 11/2015 | Donaldson | G01D 4/002 |
| 2003/0187569 A1 * | 10/2003 | Iwagami | F02D 41/221 701/114 |
| 2013/0076339 A1 | 3/2013 | Veronesi | |
| 2013/0158909 A1 | 6/2013 | Yang | |
| 2013/0187665 A1 * | 7/2013 | Rietman | G01R 19/2513 324/603 |
| 2015/0270823 A1 * | 9/2015 | Sobolewski | G01R 19/00 324/609 |

FOREIGN PATENT DOCUMENTS

| | | |
|---|---|---|
| NO | 2012038858 A2 | 3/2012 |
| NO | 2012101610 A1 | 8/2012 |
| NO | 2013011425 A1 | 1/2013 |

\* cited by examiner

DISAGGREGATION APPARATUS FOR BEING USED IN A MULTI-GROUP ELECTRICAL NETWORK

CROSS-REFERENCE TO PRIOR APPLICATIONS

This application is the U.S. National Phase application under 35 U.S.C. §371 of International Application No. PCT/EP2014/062177, filed on Jun. 12, 2014, which claims the benefit of European Patent Application No. 13172133.4, filed on Jun. 14, 2013. These applications are hereby incorporated by reference herein.

FIELD OF THE INVENTION

The invention relates to a disaggregation apparatus, a disaggregation method, and a disaggregation computer program for being used in a multi-group electrical network. The invention relates further to a system comprising the multi-group electrical network and the disaggregation apparatus for being used in the multi-group electrical network.

BACKGROUND OF THE INVENTION

In WO 2012/038858 A2, a disaggregation apparatus for being used in an electrical network comprising multiple appliances is disclosed, which is based on observing changes in a mains voltage delivered to the appliances of the electrical network. The disaggregation works best if only a single electrical group is present (or active) in the electrical network.

SUMMARY OF THE INVENTION

It is an object of the present invention to provide a disaggregation apparatus, a disaggregation method, and a disaggregation computer program for being used in a multi-group electrical network. It is a further object of the present invention to provide a system comprising the multi-group electrical network and the disaggregation apparatus for being used in the multi-group electrical network.

In a first aspect of the present invention, a disaggregation apparatus for being used in a multi-group electrical network, which comprises multiple electrical groups, each comprising one or more appliances, and which is powered by a power source, is presented, wherein the disaggregation apparatus comprises:

- for each electrical group, a voltage meter for measuring a first change in a mains voltage delivered to the appliances of the electrical group while an operational state of an appliance is changed,
- a control unit for switching, for each electrical group, a switchable load, wherein, for each electrical group, the voltage meter is adapted to measure a second change in the mains voltage while the switchable load of the electrical group is switched, and wherein, for at least one electrical group, the voltage meter is adapted to measure a third change in the mains voltage while the switchable load of another electrical group is switched, and
- a determination unit for determining the electrical group comprising the appliance, of which the operational state has been changed, based on the measured first changes in the mains voltages, the measured second changes in the mains voltages, the measured third change in the mains voltage, and the resistances of the switchable loads.

It has been found by the inventors that in a multi-group electrical network, because of cross talk between different electrical groups, a change of an operational state of an appliance of one electrical group gives rise to a change in the mains voltage of that electrical group, but may also give rise to (much smaller) changes in the mains voltages of the other groups. For this reason, if a change in the mains voltage is observed with only a single voltage sensor, it is usually not clear whether the change is to be attributed to a change of an operational state of an appliance of that electrical group or to a change of an operational state of an appliance with a much bigger load of another electrical group.

By using the measured first changes in the mains voltages, the measured second changes in the mains voltages, the measured third change in the mains voltage, and the resistances of the switchable loads, the determination unit may be able to avoid a misdetection due to a change of an operational state of an appliance in another electrical group and to improve the accuracy of disaggregation in a multi-group electrical network.

The appliances and the switchable loads are preferentially parallely connected in the electrical groups. The multi-group electrical network preferably comprises an external impedance, part of which may be attributed to a main circuit breaker of the multi-group electrical network, and the electrical groups preferably each comprise their own circuit breaker or fuse, which can be modeled as an internal impedance.

It is preferred that the determination unit is adapted to determine, for each electrical group, a change in a total admittance of the appliances of the electrical group based on the measured first changes in the mains voltages, the measured second changes in the mains voltages, the measured third change in the mains voltage, and the resistances of the switchable loads, and to determine the electrical group comprising the appliance, of which the operational state has been changed, based on the determined changes in the total admittances.

It is further preferred that the determination unit is adapted to determine, for each electrical group, the change in the total admittance based on the measured first changes in the mains voltages, a first ratio of (i) a sum of the external impedance of the multi-group electrical network and the internal impedance of the electrical group and (ii) a voltage supplied by the power source, and a second ratio of (i) the external impedance of the multi-group electrical network and (ii) the voltage supplied by the power source, wherein the first ratio and the second ratio are determined from the measured second changes in the mains voltages, the measured third change in the mains voltage, and the resistances of the switchable loads.

Preferentially, the determination unit is adapted to determine from the measured first changes in the mains voltages first changes in the reciprocal mains voltages, and to determine, for each electrical group, the change in the total admittance based on the first ratio, the second ratio, and the first changes in the reciprocal mains voltages.

The changes in the total admittances are indicative of the respective electrical group comprising the appliance, of which the operational state has been changed.

Preferentially, the determination unit comprises a memory, in which characteristics of the admittances of the appliances of the multi-group electrical network are stored. By comparing the determined changes in total admittances with the stored characteristics, the electrical group comprising the appliance, of which the operational state has been changed, can be determined.

The determination unit may be adapted to determine the changes in the total admittances based on directly solving a system of linear equations.

Additionally or alternatively, the determination unit may comprise a noise estimation unit for estimating first noise levels in the first changes in the reciprocal mains voltages, wherein the determination unit may be adapted to determine the changes in the total admittances further based on the first noise levels as an estimation that minimizes an error criterion, such as a mean square error.

The noise estimation unit may be adapted to further estimate second noise levels in the first ratios and in the second ratio, wherein the determination unit may be adapted to determine the changes in the total admittances further based on the second noise levels as an estimation that minimizes an error criterion, such as a mean square error.

Additionally or alternatively, the determination unit may be adapted to determine the changes in the total admittances based on solving, for each electrical group, a system of linear equations under the assumption that only for this electrical group the change in the total admittance is different from zero, each solution minimizing an error criterion, such as a mean square error, and on selecting the solution that results in the smallest error.

It is preferred that the determination unit is adapted to determine, for each electrical group, from the measured second change in the mains voltage a second change in the reciprocal mains voltage, and to determine the first ratio based on the resistance of the switchable load of the electrical group and the second change in the reciprocal mains voltage. This allows, for each electrical group, determining the first ratio very simple by just switching the switchable load of the electrical group, measuring the second change in the mains voltage, and performing some simple mathematics.

It is further preferred that the determination unit is adapted to determine, for the at least one electrical group, from the measured third change in the mains voltage a third change in the reciprocal mains voltage, and to determine the second ratio based on the resistance of the switchable load of the other electrical group and the third change in the reciprocal mains voltage. This allows determining the second ratio very simple by just switching the switchable load of an electrical group, measuring the second change in the mains voltage of another electrical group, and performing some simple mathematics.

It is preferred that, for each electrical group, the voltage meter is adapted to measure the mains voltage right before and right after the first change in the mains voltage, wherein the determination unit is adapted to determine, for each electrical group, a change in the power consumption based on the squared mains voltage right before or right after the first change in the mains voltage and the change in the total admittance. Thus, the determination unit can not only determine the electrical group comprising the appliance, of which the operational state has been changed, but also the change in power consumption resulting from of this change.

The disaggregation apparatus can comprise the switchable loads. However, the switchable loads can also be any other loads having known resistances. For example, the switchable loads can also be appliances of the multi-group electrical network.

In another aspect of the present invention a system comprising a multi-group electrical network, which comprises multiple electrical groups, each comprising one or more appliances, and which is powered by a power source, and a disaggregation apparatus for being used in the multi-group electrical network as defined in claim 1 is presented.

In another aspect of the present invention a disaggregation method for being used in a multi-group electrical network, which comprises multiple electrical groups, each comprising one or more appliances, and which is powered by a power source, is presented, wherein the disaggregation method comprises:
    for each electrical group, measuring a first change in a mains voltage delivered to the appliances of the electrical group while an operational state of an appliance is changed,
    for each electrical group, measuring a second change in the mains voltage while the switchable load of the electrical group is switched,
    for at least one electrical group, measuring a third change in the mains voltage while the switchable load of another electrical group is switched, and
    determining the electrical group comprising the appliance, of which the operational state has been changed, based on the measured first changes in the mains voltages, the measured second changes in the mains voltages, the measured third change in the mains voltage, and the resistances of the switchable loads.

In another aspect of the present invention a disaggregation computer program for being used in a multi-group electrical network, which comprises multiple electrical groups, each comprising one or more appliances, and which is powered by a power source, is presented, the computer program comprising program code means for causing a disaggregation apparatus as defined in claim 1 to carry out the steps of the disaggregation method as defined in claim 14, when the computer program is run on a computer controlling the disaggregation apparatus.

It shall be understood that the disaggregation apparatus of claim 1, the system of claim 13, the disaggregation method of claim 14, and the disaggregation computer program of claim 15 have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
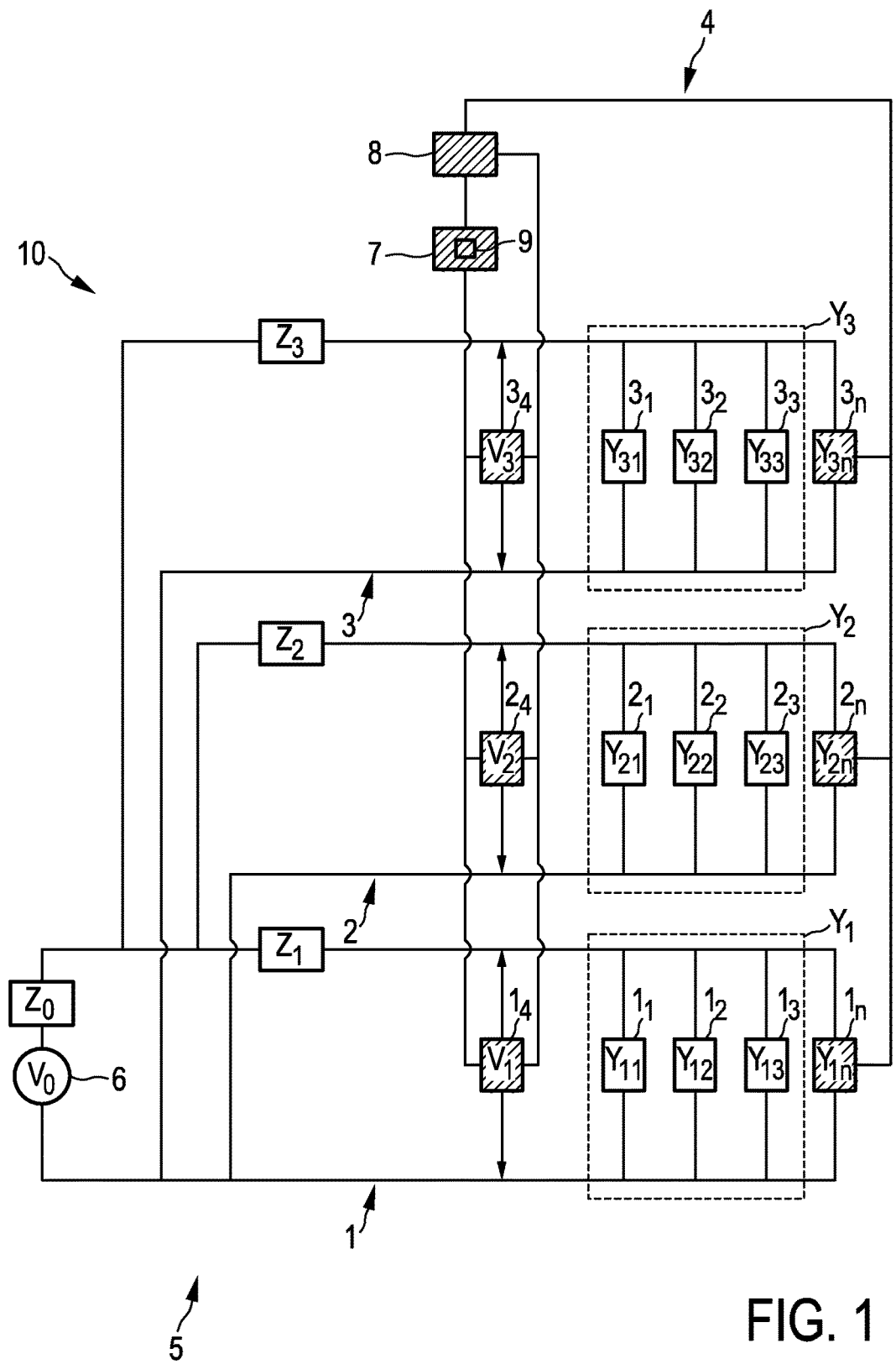
FIG. 1 shows schematically and exemplarily an embodiment of a disaggregation apparatus for being used in a multi-group electrical network.

FIG. 1 shows schematically and exemplarily a system 10 comprising a multi-group electrical network 5 and a disaggregation apparatus 4 for being used in the multi-group electrical network 5. The multi-group electrical network 5 comprises multiple electrical groups 1, 2, 3, each comprising one or more appliances $1_1$, $1_2$, $1_3$, $2_1$, $2_2$, $2_3$, $3_1$, $3_2$, $3_3$, and is powered by a power source 6. In FIG. 1, the elements of the disaggregation apparatus 4 are shaded.

The disaggregation apparatus 4 comprises, for each electrical group 1, 2, 3, a voltage meter $1_4$, $2_4$, $3_4$ for measuring a first change in a mains voltage $V_1$, $V_2$, $V_3$ delivered to the appliances $1_1$, $1_2$, $1_3$, $2_1$, $2_2$, $2_3$, $3_1$, $3_2$, $3_3$ of the electrical group 1, 2, 3 while an operational state of an appliance is changed. The disaggregation apparatus 4 further comprises, for each electrical group 1, 2, 3, a switchable load $1_n$, $2_n$, $3_n$, wherein, for each electrical group 1, 2, 3, the voltage meter $1_4$, $2_4$, $3_4$ is adapted to measure a second change in the mains voltage $V_1$, $V_2$, $V_3$ while the switchable load 1, 2, 3 of the electrical group 1, 2, 3 is switched, and wherein, for at least one electrical group 1, the voltage meter $1_4$ is adapted to measure a third change in the mains voltage $V_1$ while the switchable load $3_n$ of another electrical group 3 is switched. The disaggregation apparatus 4 further comprises a determination unit 7 for determining the electrical group 1, 2, 3 comprising the appliance, of which the operational state has been changed, based on the measured first changes in the mains voltages $V_1$, $V_2$, $V_3$, the measured second changes in the mains voltages $V_1$, $V_2$, $V_3$, the measured third change in the mains voltage $V_1$, and the resistances $R_{1n}$, $R_{2n}$, $R_{3n}$ of the switchable loads $1_n$, $2_n$, $3_n$. The appliances $1_1$, $1_2$, $1_3$, $2_1$, $2_2$, $2_3$, $3_1$, $3_2$, $3_3$ and the switchable loads $1_n$, $2_n$, $3_n$ are parallely connected in the electrical groups 1, 2, 3.

The multi-group electrical network 5, here, comprises an external impedance $Z_0$, part of which may be attributed to a main circuit breaker (not shown) of the multi-group electrical network 5, and the electrical groups 1, 2, 3 each comprise their own circuit breaker (also not shown), which is modeled as an internal impedance $Z_1$, $Z_2$, $Z_3$. Instead of a circuit breaker, a simple fuse may also be used in some embodiments.

The disaggregation apparatus 4 further comprises a control unit 8 for controlling the elements of the disaggregation apparatus 4, in particular, for controlling the voltage meters $1_4$, $2_4$, $3_4$, the switchable loads $1_n$, $2_n$, $3_n$, and the determination unit 7.

In this embodiment, the determination unit 7 is adapted to determine, for each electrical group 1, 2, 3, a change $\Delta Y_1$, $\Delta Y_2$, $\Delta Y_3$ in a total admittance $Y_1$, $Y_2$, $Y_3$ of the appliances $1_1$, $1_2$, $1_3$, $2_1$, $2_2$, $2_3$, $3_1$, $3_2$, $3_3$ of the electrical group 1, 2, 3 based on the measured first changes in the mains voltages $V_1$, $V_2$, $V_3$, the measured second changes in the mains voltages $V_1$, $V_2$, $V_3$, the measured third change in the mains voltage $V_1$, and the resistances $R_{1n}$, $R_{2n}$, $R_{3n}$ of the switchable loads $2_n$, $3_n$, and to determine the electrical group 1, 2, 3 comprising the appliance, of which the operational state has been changed, based on the determined changes $\Delta Y_1$, $\Delta Y_2$, $\Delta Y_3$ in the total admittances $Y_1$, $Y_2$, $Y_3$.

In particular, the determination unit 7 is adapted to determine, for each electrical group 1, 2, 3, the change $\Delta Y_1$, $\Delta Y_2$, $\Delta Y_3$ in the total admittance $Y_1$, $Y_2$, $Y_3$ based on the measured first changes in the mains voltages $V_1$, $V_2$, $V_3$, a first ratio of (i) a sum of the external impedance $Z_0$ of the multi-group electrical network 5 and the internal impedance $Z_1$, $Z_2$, $Z_3$ of the electrical group 1, 2, 3 and (ii) a voltage $V_0$ supplied by the power source 6, and a second ratio of (i) the external impedance $Z_0$ of the multi-group electrical network 5 and (ii) the voltage $V_0$ supplied by the power source 6, wherein the first ratio and the second ratio are determined from the measured second changes in the mains voltages $V_1$, $V_2$, $V_3$, the measured third change in the mains voltage $V_1$, and the resistances $R_{1n}$, $R_{2n}$, $R_{3n}$ of the switchable loads $1_n$, $2_n$, $3_n$.

Preferentially, the determination unit 7 is adapted to determine from the measured first changes in the mains voltages $V_1$, $V_2$, $V_3$ first changes $\Delta_1(1/V_1)$, $\Delta_1(1/V_2)$, $\Delta_1(1/V_3)$ in the reciprocal mains voltages $1/V_1$, $1/V_2$, $1/V_3$, and to determine, for each electrical group 1, 2, 3, the change $\Delta Y_1$, $\Delta Y_2$, $\Delta Y_3$ in the total admittance $Y_1$, $Y_2$, $Y_3$ based on the first ratio, the second ratio, and the first changes $\Delta_1(1/V_1)$, $\Delta_1(1/V_2)$, $\Delta_1(1/V_3)$, in the reciprocal mains voltages $1/V_1$, $1/V_2$, $1/V_3$, for example, in accordance with the following equation:

$$\Delta_1\left(\frac{1}{V_i}\right) \approx \frac{Z_0 + Z_i}{V_0}\Delta Y_i + \sum_{j \neq i} \frac{Z_0}{V_0}\Delta Y_j, \tag{1}$$

where the indices i and j relate to the electrical groups 1, 2, 3.

This may also be written in matrix-vector notation as:

$$\Delta_1\left(\frac{1}{V}\right) \approx M\Delta Y, \tag{2}$$

where $\Delta_1(1/V)$ is a column vector, in which the first changes $\Delta_1(1/V_i)$ in the reciprocal mains voltages $1/V_i$ are stacked, M is a matrix with the first ratios $(Z_0+Z_i)/V_0$ on the i-th diagonal positions and the second ratio $Z_0/V_0$ on the off-diagonal positions, and $\Delta Y$ is a column vector, in which the changes $\Delta Y_i$ in the total admittances $Y_i$ are stacked.

In this embodiment, the determination unit 7 is adapted to determine the changes $\Delta Y_1$, $\Delta Y_2$, $\Delta Y_3$ in the total admittances $Y_1$, $Y_2$, $Y_3$ based on directly solving a system of linear equations, as given, for example, by equation (1) resp. (2).

This direct solution, which is also known as "zero forcing", provides an estimation of the changes $\Delta Y_i$ in the total admittances $Y_i$—under the assumption that no noise is present in $\Delta_1(1/V)$ or M—as follows:

$$\Delta\hat{Y}_i = \frac{V_0}{Z_i}\left[\Delta_1\left(\frac{1}{V_i}\right) - \frac{\sum_j \frac{Z_0}{Z_j}\Delta_1\left(\frac{1}{V_j}\right)}{1 + \sum_j \frac{Z_0}{Z_j}}\right], \tag{3}$$

where, again, the indices i and j relate to the electrical groups 1, 2, 3 and where the symbol "^" indicates that a value is estimated.

This may also be written in matrix-vector notation as:

$$\Delta\hat{Y} = M^{-1}\Delta_1\left(\frac{1}{V}\right), \tag{4}$$

where $\Delta\hat{Y}$ is a column vector, in which the estimations of the changes $\Delta Y_i$ in the total admittances $Y_i$ are stacked, M is, again, the matrix with the first ratios $(Z_0+Z_i)/V_0$ on the i-th diagonal positions and the second ratio $Z_0/V_0$ on the off-diagonal positions, and $\Delta_1(1/V)$ is, again, the column vector, in which the first changes $\Delta_1(1/V_i)$ in the reciprocal mains voltages $1/V_i$ are stacked.

Additionally or alternatively, the determination unit 7 may comprise a noise estimation unit 9 for estimating first noise levels N in the first changes $\Delta_1(1/V_1)$, $\Delta_1(1/V_2)$, $\Delta_1(1/V_3)$ in the reciprocal mains voltages $1/V_1$, $1/V_2$, $1/V_3$, wherein the determination unit 7 may be adapted to determine the changes $\Delta Y_1$, $\Delta Y_2$, $\Delta Y_3$ in the total admittances $Y_1$, $Y_2$, $Y_3$ further based on the first noise levels N as an estimation that minimizes an error criterion, such as a mean square error, for example, in accordance with the following equation:

$$\Delta \hat{Y} = SM^T(MSM^T + N)^{-1} \Delta_1\left(\frac{1}{V}\right). \quad (5)$$

This yields an MMSE (minimum mean square error) estimator of random changes $\Delta Y_i$ in the total admittances $Y_i$ with covariance matrix S, where $S_{ij}=E[\Delta Y_i \Delta Y_j]$ is the element on the i-th row and in the j-th column of S, in the presence of noise in the first changes $\Delta_1(1/V_i)$ in the reciprocal mains voltages $1/V_i$ with estimated covariance matrix N, where $N_{ij}=E[n_i n_j]$ is the element on the i-th row and in the j-th column of N, and where $n_i$ and $n_j$ are the estimated measurement noise in $\Delta_1(1/V_i)$ and $\Delta_1(1/V_j)$, so that the measured values equal $\Delta_1(1/V_i)+n_i$ and $\Delta_1(1/V_j)+n_j$.

The estimation of the first noise levels N may be based on estimating, for each electrical group i, the noise level of the mains voltage $V_i$ as the variance $\sigma_i^2$ of a number of measurements of the same mains voltage $V_i$. The noise level $n_j$ of the first change $\Delta_1(1/V_i)$ in the reciprocal mains voltage $1/V_i$ may then be approximated from $\sigma_i^2$ as $2\sigma_i^2/V_i^4$.

The noise estimation unit 9 may be adapted to further estimate second noise levels W in the first ratios and in the second ratio, wherein the determination unit 7 may be adapted to determine the changes $\Delta Y_1$, $\Delta Y_2$, $\Delta Y_3$ in the total admittances $Y_1$, $Y_2$, $Y_3$ further based on the second noise levels W as an estimation that minimizes an error criterion, such as a mean square error, for example, in accordance with the following equation:

$$\Delta \hat{Y} = SM^T(MSM^T + N + W)^{-1} \Delta_1\left(\frac{1}{V}\right). \quad (6)$$

This yields also an MMSE estimator in the further presence of noise in the first ratios and in the second ratio, i.e., in the elements of M, with estimated covariance matrix W, where W is a diagonal matrix that incorporates the noise variances $K_{ij}$ of the estimation of the elements of M as $W_{ij}=\delta_{ij}\Sigma_k K_{ik}S_{kk}$, where $\delta_{ij}$ equals 1 if i=j and zero otherwise.

The matrix W may be obtained from the noise of M, here denoted by K, which may be derived from the variances $\sigma_i^2$ of the measured mains voltages $V_i$ (see above).

Additionally or alternatively, the determination unit 7 may be adapted to determine the changes $\Delta Y_1$, $\Delta Y_2$, $\Delta Y_3$ in the total admittances $Y_1$, $Y_2$, $Y_3$ based on solving, for each electrical group 1, 2, 3, a system of linear equations under the assumption that only for this electrical group 1, 2, 3 the change $\Delta Y_1$, $\Delta Y_2$, $\Delta Y_3$ in the total admittance $Y_1$, $Y_2$, $Y_3$ is different from zero, each solution minimizing an error criterion, such as a mean square error, and on selecting the solution that results in the smallest error, for example, in accordance with the following equations:

$$\Delta \hat{Y}_i = \frac{M_i^T \Delta_1\left(\frac{1}{V}\right)}{M_i^T M_i}, \quad (7)$$

where $M_i$ is the i-th column of M, and $$e_i = \left\| \Delta_1\left(\frac{1}{V}\right) - M_i \Delta \hat{Y}_i \right\|, \quad (8)$$

where $e_i$ is the respective error and $\|\bullet\|$ denotes the Euclidean norm of a vector.

For each electrical group 1, 2, 3, the total admittance $Y_1$, $Y_2$, $Y_3$ is the sum of the admittances $Y_{11}$, $Y_{12}$, $Y_{13}$, $Y_{21}$, $Y_{22}$, $Y_{23}$, $Y_{31}$, $Y_{32}$, $Y_{33}$ of the appliances $1_1$, $1_2$, $1_3$, $2_1$, $2_2$, $2_3$, $3_1$, $3_2$, $3_3$ of the electrical group 1, 2, 3. This is indicated in FIG. 1 by the dashed boxes with the reference signs $Y_1$, $Y_2$, $Y_3$. Preferentially, the multi-group electrical network 5 is adapted such that losses in the multi-group electrical network 5 between different appliances $1_1$, $1_2$, $1_3$, $2_1$, $2_2$, $2_3$, $3_1$, $3_2$, $3_3$ are negligible. Moreover, preferentially the voltage $V_0$ supplied by the power source 6, the external impedance $Z_0$ of the multi-group electrical network 5, and the internal impedances $Z_1$, $Z_2$, $Z_3$ of the electrical groups 1, 2, 3 are constant.

If an appliance changes its operational state, for example, is switched on or off, the total admittances $Y_1$, $Y_2$, $Y_3$ change, wherein the changes $\Delta Y_1$, $\Delta Y_2$, $\Delta Y_3$ in the total admittances $Y_1$, $Y_2$, $Y_3$ are, for example, determined in accordance with equation (1) resp. (2).

The determination unit 7 is adapted to determine, for each electrical group 1, 2, 3, from the measured second change in the mains voltage $V_1$, $V_2$, $V_3$ a second change $\Delta_2(1/V_1)$, $\Delta_2(1/V_2)$, $\Delta_2(1/V_3)$ in the reciprocal mains voltage $1/V_1$, $1/V_2$, $1/V_3$, and to determine the first ratio based on the resistance $R_{1n}=1Y_{1n}$, $R_{2n}=1Y_{2n}R_{3n}=1Y_{3n}$ of the switchable load $1_n$, $2_n$, $3_n$ of the electrical group 1, 2, 3 and the second change $\Delta_2(1/V_1)$, $\Delta_2(1/V_2)$, $\Delta_2(1/V_3)$, in the reciprocal mains voltage $1/V_1$, $1/V_2$, $1/V_3$, for example, in accordance with the following equation:

$$\frac{Z_0 + Z_i}{V_0} \approx \pm(R_{in}\Delta_2(1/V_i)), \quad (9)$$

where the index i relates to the electrical groups 1, 2, 3 and where the sign "+" indicates that the load is switched on and the sign "−" indicates that the load $1_n$, $2_n$, $3_n$ is switched off. Thus, the switchable loads $1_n$, $2_n$, $3_n$ are switched on or switched off and the first ratios $(Z_0+Z_i)/V_0$ are determined, for example, in accordance with equation (9).

The determination unit 7 is further adapted to determine, for the at least one electrical group 1, from the measured third change in the mains voltage $V_1$ a third change $\Delta_3(1/V_1)$ in the reciprocal mains voltage $1/V_1$, and to determine the second ratio based on the resistance $R_{3n}=1/Y_{3n}$ of the switchable load $3_n$ of the other electrical group 3 and the third change $\Delta_3(1/V_1)$ in the reciprocal mains voltage $1/V_1$, for example, in accordance with the following equation:

$$\frac{Z_0}{V_0} \approx \pm(R_{jn}\Delta_3(1/V_i)), \quad (10)$$

where the indices i and j relate to the electrical groups 1, 2, 3 and i≠j. In this example, i equals 1 and j equals 3. The sign "+" then indicates that the load $3_n$ is switched on and the sign "−" indicates that the load $3_n$ is switched off. Thus, the switchable load $3_n$ is switched on or switched off and the second ratio $Z_0/V_0$ is determined, for example, in accordance with equation (10).

The disaggregation apparatus 4 can be adapted to switch the switchable loads $1_n$, $2_n$, $3_n$, measure the second changes $\Delta_2(1/V_1)$, $\Delta_2(1/V_2)$, $\Delta_2(1/V_3)$ in the reciprocal mains voltages $1/V_1$, $1/V_2$, $1/V_3$, and determine the first ratios $(Z_0+Z_i)/V_0$ repeatedly at regular intervals or on demand, for example, on demand of a user, in order to update the determination of the first ratios $(Z_0+Z_i)/V_0$. Likewise, the disaggregation apparatus 4 can be adapted to switch the switchable load $3_n$ of an electrical group 3, measure the third change $\Delta_3(1/V_1)$ in the reciprocal mains voltage $1/V_1$ of another electrical group 1, and determine the second ratio $Z_0/V_0$ repeatedly at regular intervals or on demand, for example, on demand of a user, in order to update the determination of the second ratio $Z_0/V_0$. These updates are particularly preferred if the multi-group electrical network 5 is not very stable and if, thus, these ratios vary.

For each electrical group 1, 2, 3, the voltage meter $1_4$, $2_4$, $3_4$ is preferentially adapted to measure the mains voltage $V_1$, $V_2$, $V_3$ right before and right after the first change in the mains voltage $V_1$, $V_2$, $V_3$, wherein the determination unit 7 is preferentially adapted to determine, for each electrical group 1, 2, 3, a change in the power consumption based on the squared mains voltage $V_1$, $V_2$, $V_3$ right before or right after the first change in a mains voltage $V_1$, $V_2$, $V_3$ and the change $\Delta Y_1$, $\Delta Y_2$, $\Delta Y_3$ in the total admittance $Y_1$, $Y_2$, $Y_3$, for example, in accordance with the following equation:

$$\Delta P_i = V_i^2 \Delta Y_i, \quad (11)$$

where the index i relates to the electrical groups 1, 2, 3 and where $V_i$ is the mains voltage right before the first change in the mains voltage $V_i$ if the real part of $\Delta Y_i$ is negative, and the mains voltage right after the first change in the mains voltage $V_i$, if the real part of $\Delta Y_i$ is positive.

Figure 2:
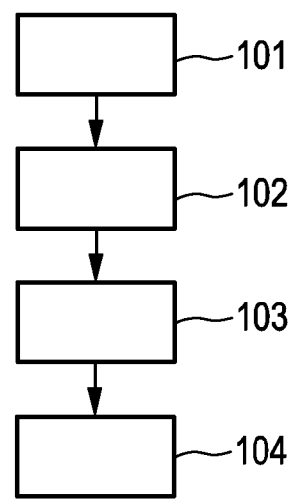
FIG. 2 shows a flowchart exemplarily illustrating an embodiment of a disaggregation method for being used in a multi-group electrical network.

In the following, an embodiment of a disaggregation method for being used in a multi-group electrical network will exemplarily be described with reference to a flowchart shown in FIG. 2.

In step 101, for each electrical group 1, 2, 3, a first change in a mains voltage $V_1$, $V_2$, $V_3$ delivered to the appliances $1_1$, $1_2$, $1_3$, $2_1$, $2_2$, $2_3$, $3_1$, $3_2$, $3_3$ of the electrical group 1, 2, 3 is measured while an operational state of an appliance is changed, in step 102, for each electrical group 1, 2, 3, a second change in the mains voltage $V_1$, $V_2$, $V_3$ is measured while the switchable load $1_n$, $2_n$, $3_n$ of the electrical group 1, 2, 3 is switched, in step 103, for at least one electrical group 1, a third change in the mains voltage $V_1$ is measured while the switchable load $3_n$ of another electrical group 3 is switched, and in step 104, the electrical group 1, 2, 3 comprising the appliance, of which the operational state has been changed, is determined based on the measured first changes in the mains voltages $V_1$, $V_2$, $V_3$, the measured second changes in the mains voltages $V_1$, $V_2$, $V_3$, the measured third change in the main voltage $V_1$, and the resistances $R_{1n}$, $R_{2n}$, $R_{3n}$ of the switchable loads $1_n$, $2_n$, $3_n$.

Steps 102 and 103 can be performed before step 101, and step 103 can be performed before step 102. In an embodiment, firstly steps 102 and 103 are performed in this order and the ratios $(Z_0+Z_i)/V_0$ and $Z_0/V_0$ are determined, and then steps 101 and 104 are repeatedly performed with the same determined ratios $(Z_0+Z_i)/V_0$ and $Z_0/V_0$ as described above. In the multi-group electrical network is not very stable, steps 102 and 103 can be performed repeatedly at certain time intervals or on demand, in order to update the ratios $(Z_0+Z_i)/V_0$ and $Z_0/V_0$.

The disaggregation apparatus and the disaggregation method are preferentially used for home monitoring and for disaggregating energy usage.

Although in the embodiment described above with reference to FIG. 1, the multi-group electrical network comprises three electrical groups, each comprising three appliances, the multi-group electrical network can, of course, also comprise more or less than three electrical groups and each electrical group can, of course, also comprise more or less than three appliances.

Although in the embodiment described above with reference to FIG. 1, the disaggregation apparatus comprises switchable loads which are controlled by a control unit of the disaggregation apparatus, alternatively, the switchable loads can be elements of the multi-group electrical network, for example, appliances of the multi-group electrical network. Even if the switchable loads are not comprised by the disaggregation apparatus, but by the multi-group electrical network, the control unit is adapted to switch the switchable loads.

Although in the embodiment described above with reference to FIG. 1, the second ratio is determined based on the resistance $R_{3n}$ of the switchable load $3_n$ of the third electrical group 3 and the third change $\Delta_3(1/V_1)$ in the reciprocal mains voltage $1/V_1$ of the first electrical group 1, other combinations are possible. For example, the second ratio can be determined based on the resistance $R_{2n}$ of the switchable load $2_n$ of the second electrical group 2 and the third change $\Delta_3(1/V_3)$ in the reciprocal mains voltage $1/V_3$ of the third electrical group 3.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Determinations like the determination of the electrical group comprising the appliance, of which the operational state has been changed, the determination of a change in the power consumption of the multi-group electrical network, the determination of the ratios $(Z_0+Z_i)/V_0$ and $Z_0/V_0$, et cetera performed by one or several units or devices can be performed by any other number of units or devices. The determinations and/or the control of the disaggregation apparatus for being used in a multi-group electrical network in accordance with the disaggregation method for being used in a multi-group electrical network can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a disaggregation apparatus for being used in a multi-group electrical network, which comprises multiple electrical groups, each comprising one or more appliances. For each electrical group, a voltage meter measures a first change in a mains voltage delivered to the appliances of the electrical group while an operational state of an appliance is changed, and a second change in the mains voltage while a switchable load of the electrical group is switched. For at least one electrical group, the voltage meter measures a third change in the mains voltage while the switchable load of another electrical group is switched. A determination unit determines the electrical group comprising the appliance, of which the operational state has been changed, based on the measured first changes in the mains voltages, the measured second changes in the mains voltages, the measured third change in the mains voltage, and the resistances of the switchable loads. Thus, a misdetection due to a change of an operational state of an appliance in another electrical group may be avoided and the accuracy of disaggregation may be improved in a multi-group electrical network.

The invention claimed is:

1. A disaggregation apparatus (4) for being used in a multi-group electrical network (5), which comprises multiple electrical groups (1, 2, 3), each comprising one or more appliances ($1_1$, $1_2$, $1_3$, $2_1$, $2_2$, $2_3$, $3_1$, $3_2$, $3_3$), and which is powered by a power source (6), wherein the disaggregation apparatus (4) comprises:
for each electrical group (1, 2, 3), a voltage meter ($1_4$, $2_4$, $3_4$) for measuring a first change in a mains voltage ($V_1$, $V_2$, $V_3$) delivered to the appliances ($1_1$, $1_2$, $1_3$, $2_1$, $2_2$, $2_3$, $3_1$, $3_2$, $3_3$) of the electrical group (1, 2, 3) while an operational state of an appliance is changed,
a control unit (8) for switching, for each electrical group (1, 2, 3), a switchable load ($1_n$, $2_n$, $3_n$), wherein,
for each electrical group (1, 2, 3), the voltage meter ($1_4$, $2_4$, $3_4$) is adapted to measure a second change in the mains voltage ($V_1$, $V_2$, $V_3$) while the switchable load ($1_n$, $2_n$, $3_n$) of the electrical group (1, 2, 3) is switched, and wherein,
for at least one electrical group (1), the voltage meter ($1_4$) is adapted to measure a third change in the mains voltage ($V_1$) while the switchable load ($3_n$) of another electrical group (3) is switched, and
a determination unit (7) for determining the electrical group (1, 2, 3) comprising the appliance, of which the operational state has been changed, based on the measured first changes in the mains voltages ($V_1$, $V_2$, $V_3$), the measured second changes in the mains voltages ($V_1$, $V_2$, $V_3$), the measured third change in the mains voltage ($V_1$), and the resistances ($R_{1n}$, $R_{2n}$, $R_{3n}$) of the switchable loads ($1_n$, $2_n$, $3_n$).

2. The disaggregation apparatus (4) as defined in claim 1, wherein the determination unit (7) is adapted to determine, for each electrical group (1, 2, 3), a change ($\Delta Y_1$, $\Delta Y_2$, $\Delta Y_3$) in a total admittance ($Y_1$, $Y_2$, $Y_3$) of the appliances ($1_1$, $1_2$, $1_3$, $2_1$, $2_2$, $2_3$, $3_1$, $3_2$, $3_3$) of the electrical group (1, 2, 3) based on the measured first changes in the mains voltages ($V_1$, $V_2$, $V_3$), the measured second changes in the mains voltages ($V_1$, $V_2$, $V_3$), the measured third change in the mains voltage ($V_1$, $V_2$, $V_3$), and the resistances ($R_{1n}$, $R_{2n}$, $R_{3n}$) of the switchable loads ($1_n$, $2_n$, $3_n$), and to determine the electrical group (1, 2, 3) comprising the appliance, of which the operational state has been changed, based on the determined changes ($\Delta Y_1$, $\Delta Y_2$, $\Delta Y_3$) in the total admittances ($Y_1$, $Y_2$, $Y_3$).

3. The disaggregation apparatus (4) as defined in claim 2, wherein the determination unit (7) is adapted to determine, for each electrical group (1, 2, 3), the change ($\Delta Y_1$, $\Delta Y_2$, $\Delta Y_3$) in the total admittance ($Y_1$, $Y_2$, $Y_3$) based on the measured first changes in the mains voltages ($V_1$, $V_2$, $V_3$), a first ratio of (i) a sum of an external impedance ($Z_0$) of the multi-group electrical network (5) and an internal impedance ($Z_1$, $Z_2$, $Z_3$) of the electrical group (1, 2, 3) and (ii) a voltage ($V_0$) supplied by the power source (6), and a second ratio of (i) the external impedance ($Z_0$) of the multi-group electrical network (5) and (ii) the voltage ($V_0$) supplied by the power source (6), wherein the first ratio and the second ratio are determined from the measured second changes in the mains voltages ($V_1$, $V_2$, $V_3$), the measured third change in the mains voltage ($V_1$), and the resistances ($R_{1n}$, $R_{2n}$, $R_{3n}$) of the switchable loads ($1_n$, $2_n$, $3_n$).

4. The disaggregation apparatus (4) as defined in claim 3, wherein the determination unit (7) is adapted to determine from the measured first changes in the mains voltages ($V_1$, $V_2$, $V_3$) first changes ($\Delta_1(1/V_1)$, $\Delta_1(1/V_2)$, $\Delta_1(1/V_3)$) in the reciprocal mains voltages ($1/V_1$, $1/V_2$, $1/V_3$), and to determine, for each electrical group (1, 2, 3), the change ($\Delta Y_1$, $\Delta Y_2$, $\Delta Y_3$) in the total admittance ($Y_1$, $Y_2$, $Y_3$) based on the first ratio, the second ratio, and the first changes ($\Delta_1(1/V_1)$, $\Delta_1(1/V_2)$, $\Delta_1(1/V_3)$) in the reciprocal mains voltages ($1/V_1$, $1/V_2$, $1/V_3$).

5. The disaggregation apparatus (4) as defined in claim 4, wherein the determination unit (7) is adapted to determine the changes ($\Delta Y_1$, $\Delta Y_2$, $\Delta Y_3$) in the total admittances ($Y_1$, $Y_2$, $Y_3$) based on directly solving a system of linear equations.

6. The disaggregation apparatus (4) as defined in claim 4, wherein the determination unit (7) comprises:
a noise estimation unit (9) for estimating first noise levels (N) in the first changes ($\Delta_1(1/V_1)$, $\Delta_1(1/V_2)$, $\Delta_1(1/V_3)$) in the reciprocal mains voltages ($1/V_1$, $1/V_2$, $1/V_3$), wherein the determination unit (7) is adapted to determine the changes ($\Delta Y_1$, $\Delta Y_2$, $\Delta Y_3$) in the total admittances ($Y_1$, $Y_2$, $Y_3$) further based on the first noise levels (N) as an estimation that minimizes an error criterion.

7. The disaggregation apparatus (4) as defined in claim 6, wherein the noise estimation unit (7) is adapted to further estimate second noise levels (W) in the first ratios and in the second ratio, wherein the determination unit (7) is adapted to determine the changes ($\Delta Y_1$, $\Delta Y_2$, $\Delta Y_3$) in the total admittances ($Y_1$, $Y_2$, $Y_3$) further based on the second noise levels (W) as an estimation that minimizes an error criterion.

8. The disaggregation apparatus (4) as defined in claim 4, wherein the determination unit (7) is adapted to determine the changes ($\Delta Y_1$, $\Delta Y_2$, $\Delta Y_3$) in the total admittances ($Y_1$, $Y_2$, $Y_3$) based on solving, for each electrical group (1, 2, 3), a system of linear equations under the assumption that only for this electrical group (1, 2, 3) the change ($\Delta Y_1$, $\Delta Y_2$, $\Delta Y_3$) in the total admittance ($Y_1$, $Y_2$, $Y_3$) is different from zero, each solution minimizing an error criterion, and on selecting the solution that results in the smallest error.

9. The disaggregation apparatus (4) as defined in claim 4, wherein the determination unit (7) is adapted to determine, for each electrical group (1, 2, 3), from the measured second change in the mains voltage ($V_1$, $V_2$, $V_3$) a second change ($\Delta_2(1/V_1)$, $\Delta_2(1/V_2)$, $\Delta_2(1/V_3)$) in the reciprocal mains voltage ($1/V_1$, $1/V_2$, $1/V_3$), and to determine the first ratio based on the resistance ($R_{1n}$, $R_{2n}$, $R_{3n}$) of the switchable load ($1_n$, $2_n$, $3_n$) of the electrical group (1, 2, 3) and the second change ($\Delta_2(1/V_1)$, $\Delta_2(1/V_2)$, $\Delta_2(1/V_3)$) in the reciprocal mains voltage ($1/V_1$, $1/V_2$, $1/V_3$).

10. The disaggregation apparatus (4) as defined in claim 4, wherein the determination unit (7) is adapted to determine, for the at least one electrical group (1), from the measured third change in the mains voltage ($V_1$) a third change ($\Delta_3(1/V_1)$) in the reciprocal mains voltage ($1/V_1$), and to determine the second ratio based on the resistance ($R_{3n}$) of the switchable load ($3_n$) of the other electrical group (3) and the third change ($\Delta_3(1/V_1)$) in the reciprocal mains voltage ($1/V_1$).

11. The disaggregation apparatus (4) as defined in claim 2, wherein, for each electrical group (1, 2, 3), the voltage meter ($1_4$, $2_4$, $3_4$) is adapted to measure the mains voltage ($V_1$, $V_2$, $V_3$) right before and right after the first change in the mains voltage ($V_1$, $V_2$, $V_3$), wherein the determination unit (7) is adapted to determine, for each electrical group (1, 2, 3), a change in the power consumption based on the squared mains voltage ($V_1$, $V_2$, $V_3$) right before or right after the first change in the mains voltage ($V_1$, $V_2$, $V_3$) and the change ($\Delta Y_1$, $\Delta Y_2$, $\Delta Y_3$) in the total admittance ($Y_1$, $Y_2$, $Y_3$).

12. The disaggregation apparatus (4) as defined in claim 1, wherein the disaggregation apparatus (4) comprises the switchable loads ($1_n$, $2_n$, $3_n$).

13. A system (10) comprising a multi-group electrical network (5), which comprises multiple electrical groups (1, 2, 3), each comprising one or more appliances ($1_1$, $1_2$, $1_3$, $2_i$, $2_2$, $2_3$, $3_1$, $3_2$, $3_3$), and which is powered by a power source (6), and a disaggregation apparatus (4) for being used in the multi-group electrical network (5) as defined in claim 1.

14. A disaggregation method for being used in a multi-group electrical network (5), which comprises multiple electrical groups (1, 2, 3), each comprising one or more appliances ($1_1$, $1_2$, $1_3$, $2_i$, $2_2$, $2_3$, $3_i$, $3_2$, $3_3$), and which is powered by a power source (6), wherein the disaggregation method comprises:

for each electrical group (1, 2, 3), measuring a first change in a mains voltage ($V_1$, $V_2$, $V_3$) delivered to the appliances ($1_1$, $1_2$, $1_3$, $2_i$, $2_2$, $2_3$, $3_i$, $3_2$, $3_3$) of the electrical group (1, 2, 3) while an operational state of an appliance is changed, for each electrical group (1, 2, 3), measuring a second change in the mains voltage ($V_1$, $V_2$, $V_3$) while the switchable load ($1_n$, $2_n$, $3_n$) of the electrical group (1, 2, 3) is switched, for at least one electrical group (1), measuring a third change in the mains voltage ($V_1$) while the switchable load ($3_n$) of another electrical group (3) is switched, and determining the electrical group (1, 2, 3) comprising the appliance, of which the operational state has been changed, based on the measured first changes in the mains voltages ($V_1$, $V_2$, $V_3$), the measured second changes in the mains voltages ($V_1$, $V_2$, $V_3$), the measured third change in the mains voltage ($V_1$), and the resistances ($R_{1n}$, $R_{2n}$, $R_{3n}$) of the switchable loads ($1_n$, $2_n$, $3_n$).

15. A disaggregation computer program for being used in a multi-group electrical network (5), which comprises multiple electrical groups (1, 2, 3), each comprising one or more appliances ($1_1$, $1_2$, $1_3$, $2_i$, $2_2$, $2_3$, $3_i$, $3_2$, $3_3$), and which is powered by a power source (6), the computer program comprising program code means for causing a disaggregation apparatus to carry out the steps of the disaggregation method as defined in claim 14, when the computer program is run on a computer controlling the disaggregation apparatus (4).

* * * * *